US008871298B2

(12) United States Patent
Roehrig et al.

(10) Patent No.: US 8,871,298 B2
(45) Date of Patent: Oct. 28, 2014

(54) METHOD FOR MANUFACTURING ON A FILM SUBSTRATE AT A TEMPERATURE ABOVE ITS GLASS TRANSITION

(75) Inventors: Mark A. Roehrig, Stillwater, MN (US); Yufeng Liu, Woodbury, MN (US); Robert W. Peterson, Spring Valley, WI (US)

(73) Assignee: 3M Innovative Properties Company, St. Paul, MN (US)

( * ) Notice: Subject to any disclaimer, the term of this patent is extended or adjusted under 35 U.S.C. 154(b) by 1441 days.

(21) Appl. No.: 12/278,431

(22) PCT Filed: Feb. 7, 2007

(86) PCT No.: PCT/US2007/003340
§ 371 (c)(1),
(2), (4) Date: Oct. 22, 2008

(87) PCT Pub. No.: WO2007/092541
PCT Pub. Date: Aug. 16, 2007

(65) Prior Publication Data
US 2009/0155458 A1    Jun. 18, 2009

Related U.S. Application Data

(60) Provisional application No. 60/771,413, filed on Feb. 8, 2006.

(51) Int. Cl.
| | |
|---|---|
| *B05D 3/12* | (2006.01) |
| *B29C 71/00* | (2006.01) |
| *B29C 71/02* | (2006.01) |
| *B05D 5/06* | (2006.01) |
| *B29D 7/01* | (2006.01) |
| *B29D 11/00* | (2006.01) |
| *H01L 51/00* | (2006.01) |
| *H01L 51/56* | (2006.01) |

(52) U.S. Cl.
CPC ............. *H01L 51/0097* (2013.01); *H01L 51/56* (2013.01); *Y02E 10/549* (2013.01)
USPC ............ 427/171; 427/66; 427/173; 264/1.34; 264/1.7; 264/2.7; 264/290.2; 264/291; 264/235

(58) Field of Classification Search
None
See application file for complete search history.

(56) References Cited

U.S. PATENT DOCUMENTS

| | | | |
|---|---|---|---|
| 236,068 | A | 12/1880 | Newcomb |
| 273,040 | A | 2/1883 | Dexter |

(Continued)

FOREIGN PATENT DOCUMENTS

| | | |
|---|---|---|
| EP | 0 140 496 A1 | 5/1985 |
| EP | 0 472 393 A2 | 2/1992 |

(Continued)

OTHER PUBLICATIONS

Shirota "Organic Materials for Electronic and Optoelectronic Devices", Journal of Materials Chemistry, (2000), pp. 1-25, vol. 10, The Royal Society of Chemistry.

(Continued)

*Primary Examiner* — Jeffrey Wollschlager
(74) *Attorney, Agent, or Firm* — James A. Baker; Lisa A. Fulton (57) ABSTRACT

A method for preparing a flexible film substrate with a low glass transition temperature can be used in the production of an article that retains dimensions and improves the surface smoothness after high temperature processing. The invention, for example, would enable low temperature films such as PET and PEN to be dimensionally stable and ultra flat at conditions commonly used in electronic processing which can typically exceed 200° C. More specifically, the methods enable the use of e.g. barrier films based on PET or PEN in OLED/PLED manufacturing.

16 Claims, 3 Drawing Sheets

(56) References Cited

U.S. PATENT DOCUMENTS

| | | | |
|---|---|---|---|
| 478,255 A | 7/1892 | Edwards et al. |
| 751,527 A | 2/1904 | Marr |
| 754,797 A | 3/1904 | Ostrander |
| 1,167,036 A | 1/1916 | Witham, Sr. et al. |
| 1,191,297 A | 7/1916 | Gardner |
| 1,238,742 A | 9/1917 | Butler |
| 1,288,643 A | 12/1918 | Mayer |
| 1,432,832 A | 10/1922 | Brockett |
| 1,489,875 A | 10/1923 | Beauregard |
| 1,481,866 A | 1/1924 | Heist |
| RE16,384 E | 7/1926 | McCrohan et al. |
| 1,654,946 A | 1/1928 | Sinks |
| 1,691,023 A | 11/1928 | Dye |
| 1,792,596 A | 2/1931 | Livingston |
| 1,880,451 A | 10/1932 | Hopkins |
| 1,891,782 A | 12/1932 | Sager |
| 2,027,564 A | 1/1936 | Stein et al. |
| 2,028,700 A | 1/1936 | Guier |
| 2,037,825 A | 4/1936 | Salfisberg |
| 2,043,036 A | 6/1936 | Duncan |
| 2,066,872 A | 1/1937 | Adams et al. |
| 2,070,505 A | 2/1937 | Beck |
| 2,137,887 A | 11/1938 | Abbott |
| 2,141,318 A | 12/1938 | Salfisberg |
| 2,152,101 A | 3/1939 | Scherer |
| 2,184,744 A | 12/1939 | Jonassen |
| 2,259,362 A | 10/1941 | Young |
| 2,293,178 A | 8/1942 | Stocker |
| 2,307,817 A | 1/1943 | Austin |
| 2,334,022 A | 11/1943 | Minich |
| 2,335,190 A | 11/1943 | Minich |
| 2,339,070 A | 1/1944 | Hayes |
| 2,348,162 A | 5/1944 | Warner |
| 2,370,811 A | 3/1945 | Osgood, Jr. |
| 2,373,040 A | 4/1945 | Macdonald et al. |
| 2,398,822 A | 4/1946 | Faris et al. |
| 2,403,482 A | 7/1946 | Cloud |
| 2,411,774 A | 11/1946 | Gundelfinger |
| 2,412,187 A | 12/1946 | Wiley et al. |
| 2,434,111 A | 1/1948 | Hawley, Jr. et al. |
| 2,454,999 A | 11/1948 | Eaton |
| 2,468,697 A | 4/1949 | Wiley |
| 2,483,339 A | 9/1949 | Gardner et al. |
| 2,490,781 A | 12/1949 | Cloud |
| 2,505,146 A | 4/1950 | Ryan |
| 2,531,619 A | 11/1950 | Gonia |
| 2,540,986 A | 2/1951 | Klein et al. |
| 2,545,868 A | 3/1951 | Bailey |
| 2,547,836 A | 4/1951 | Pfeiffer |
| 2,559,365 A | 7/1951 | Middleton et al. |
| 2,559,705 A | 7/1951 | Borkland |
| 2,578,899 A | 12/1951 | Pace, Jr. |
| 2,582,165 A | 1/1952 | Rosenfeld |
| 2,597,877 A | 5/1952 | LeClair |
| 2,600,295 A | 6/1952 | Hommel |
| 2,618,012 A | 11/1952 | Milne |
| 2,658,432 A | 11/1953 | Baumgartner |
| 2,660,218 A | 11/1953 | Johnson et al. |
| 2,698,982 A | 1/1955 | Smith et al. |
| 2,702,406 A | 2/1955 | Reed |
| 2,737,089 A | 3/1956 | Baumgartner |
| 2,745,134 A | 5/1956 | Collins |
| 2,893,053 A | 7/1959 | Powell |
| 2,918,891 A | 12/1959 | Klabunde |
| 2,918,897 A | 12/1959 | Zernov |
| 2,976,924 A | 3/1961 | Baxter, Jr. |
| 3,044,228 A | 7/1962 | Peterson |
| 3,076,492 A | 2/1963 | Monks |
| 3,344,493 A | 10/1967 | Telgheider |
| 3,366,298 A | 1/1968 | Bahrani |
| 3,373,288 A | 3/1968 | Otepka et al. |
| 3,482,343 A * | 12/1969 | Hamu .................. 38/102.5 |
| 3,498,878 A | 3/1970 | Obenshain |
| 3,510,036 A | 5/1970 | Lewis, Jr. et al. |
| 3,552,668 A | 1/1971 | Kanno |
| 3,567,093 A | 3/1971 | Johnson |
| 3,604,652 A | 9/1971 | Sleeper |
| 3,724,732 A | 4/1973 | Bonner |
| 3,774,831 A | 11/1973 | Paradine |
| 3,799,038 A | 3/1974 | Bossons et al. |
| 3,831,828 A | 8/1974 | Royon et al. |
| 3,854,441 A | 12/1974 | Park |
| 3,890,547 A | 6/1975 | Keck |
| 3,913,729 A | 10/1975 | Andrews |
| 3,939,025 A | 2/1976 | Kane |
| 3,974,952 A | 8/1976 | Swanke et al. |
| 3,976,528 A | 8/1976 | James |
| 4,002,047 A | 1/1977 | MacPhee et al. |
| 4,013,284 A | 3/1977 | Demetre |
| 4,015,050 A | 3/1977 | Birchall et al. |
| 4,033,492 A | 7/1977 | Imai |
| 4,060,236 A | 11/1977 | Carstedt |
| 4,069,081 A | 1/1978 | Drower et al. |
| 4,069,959 A | 1/1978 | Bartell et al. |
| 4,119,309 A | 10/1978 | Mayer et al. |
| 4,141,735 A | 2/1979 | Schrader et al. |
| 4,182,472 A | 1/1980 | Peekna |
| 4,187,113 A | 2/1980 | Mathews et al. |
| 4,190,245 A | 2/1980 | Brandes |
| 4,300,891 A | 11/1981 | Bemiss |
| 4,300,969 A | 11/1981 | Frydendal |
| 4,322,802 A | 3/1982 | Lewis et al. |
| 4,342,412 A | 8/1982 | Lorenz et al. |
| 4,343,991 A | 8/1982 | Fujiwara et al. |
| 4,360,356 A | 11/1982 | Hall |
| 4,389,455 A | 6/1983 | Asao |
| 4,467,949 A | 8/1984 | Nakata |
| 4,471,816 A | 9/1984 | Wada |
| 4,539,072 A | 9/1985 | Frye et al. |
| 4,598,849 A | 7/1986 | Frye et al. |
| 4,657,614 A | 4/1987 | Andersson |
| 4,685,230 A * | 8/1987 | Mason, III .................. 38/102.5 |
| 4,862,565 A | 9/1989 | Damour |
| 4,917,844 A | 4/1990 | Komai et al. |
| 4,925,520 A | 5/1990 | Beaudoin et al. |
| 4,952,281 A | 8/1990 | Akira |
| 5,124,743 A | 6/1992 | Shiota |
| 5,141,484 A | 8/1992 | Akira |
| 5,244,861 A | 9/1993 | Campbell et al. |
| 5,290,672 A | 3/1994 | Dunk |
| 5,387,501 A | 2/1995 | Yajima et al. |
| 5,466,519 A | 11/1995 | Shirakura et al. |
| 5,517,737 A | 5/1996 | Viltro et al. |
| 5,560,793 A | 10/1996 | Ruscher et al. |
| 5,621,131 A | 4/1997 | Kreuder et al. |
| 5,677,050 A | 10/1997 | Bilkadi et al. |
| 5,708,130 A | 1/1998 | Woo et al. |
| 5,728,801 A | 3/1998 | Wu et al. |
| 5,840,217 A | 11/1998 | Lupo et al. |
| 5,853,965 A | 12/1998 | Haydock et al. |
| 5,866,282 A | 2/1999 | Bourdelais et al. |
| 5,869,350 A | 2/1999 | Heeger et al. |
| 5,874,205 A | 2/1999 | Bourdelais et al. |
| 5,888,643 A | 3/1999 | Aylward et al. |
| 5,900,327 A | 5/1999 | Pei et al. |
| 5,929,194 A | 7/1999 | Woo et al. |
| 5,975,745 A | 11/1999 | Oishi et al. |
| 6,030,715 A | 2/2000 | Thompson et al. |
| 6,030,742 A | 2/2000 | Bourdelais et al. |
| 6,132,641 A | 10/2000 | Rietz et al. |
| 6,150,043 A | 11/2000 | Thompson et al. |
| 6,152,345 A | 11/2000 | Griffin et al. |
| 6,169,163 B1 | 1/2001 | Woo et al. |
| 6,242,115 B1 | 6/2001 | Thomson et al. |
| 6,272,984 B1 | 8/2001 | Kato et al. |
| 6,273,984 B1 | 8/2001 | Bourdelais et al. |
| 6,362,020 B1 | 3/2002 | Shimoda et al. |
| 6,489,015 B1 | 12/2002 | Tsuchiya et al. |
| 6,626,343 B2 | 9/2003 | Crowley et al. |
| 6,680,084 B1 | 1/2004 | Chtourou |
| 6,686,031 B2 | 2/2004 | Matsufuji et al. |
| 6,820,671 B2 | 11/2004 | Calvert |
| 6,994,906 B2 | 2/2006 | Burroughes et al. |
| 7,160,587 B2 | 1/2007 | Doi |

(56) References Cited

U.S. PATENT DOCUMENTS

| | | |
|---|---|---|
| 2001/0030122 A1 | 10/2001 | Hara et al. |
| 2001/0051275 A1 | 12/2001 | Muraoka |
| 2003/0082977 A1 | 5/2003 | Kuroiwa et al. |
| 2004/0195967 A1 | 10/2004 | Padiyath et al. |
| 2004/0235380 A1 | 11/2004 | Kapik |
| 2004/0247916 A1* | 12/2004 | MacDonald et al. ......... 428/523 |
| 2005/0016464 A1 | 1/2005 | Duggal et al. |
| 2005/0059777 A1 | 3/2005 | Doi |
| 2005/0133965 A1 | 6/2005 | Yu et al. |
| 2005/0212173 A1 | 9/2005 | Swanson |
| 2005/0227389 A1 | 10/2005 | Bhattacharya et al. |
| 2005/0246965 A1 | 11/2005 | Swanson |
| 2006/0024895 A1 | 2/2006 | Kim |
| 2006/0182901 A1 | 8/2006 | Takagi |
| 2008/0081123 A1 | 4/2008 | Swanson et al. |
| 2008/0081164 A1 | 4/2008 | Swanson et al. |

FOREIGN PATENT DOCUMENTS

| | | |
|---|---|---|
| EP | 0 658 505 A1 | 6/1995 |
| EP | 0 672 516 A2 | 9/1995 |
| EP | 0 688 665 B1 | 12/1995 |
| EP | 1 066 979 A2 | 1/2001 |
| EP | 0 939 063 B1 | 7/2001 |
| EP | 1 258 555 A1 | 11/2002 |
| EP | 1 317 966 A2 | 6/2003 |
| GB | 456832 | 8/1935 |
| JP | 63-171755 | 7/1988 |
| JP | 2000-195673 | 7/2000 |
| JP | 2005-218949 | 8/2005 |
| WO | WO 97/32069 A1 | 9/1997 |
| WO | WO 98/55561 A1 | 12/1998 |
| WO | WO 98/56702 A1 | 12/1998 |
| WO | WO 99/40655 A1 | 8/1999 |
| WO | WO 00/18851 A1 | 4/2000 |
| WO | WO 00/70655 A2 | 11/2000 |
| WO | WO 03/022575 | 3/2003 |
| WO | WO 03/087247 | 10/2003 |
| WO | WO 2007/110484 A1 | 10/2007 |
| WO | WO 2008/039822 A1 | 4/2008 |

OTHER PUBLICATIONS

Kraft et al., "Electroluminescent Conjugated Polymers—Seeing Polymers in a New Light", Angew. Chem. Int. Ed., (1998), pp. 402-428, vol. 37, Wiley-VCH Verlag GmbH, D-69451 Weinheim.

Fujikawa et al., "Energy Structures of Triphenylamine Oligomers", Synthetic Metals, (1997), pp. 161-162, vol. 91, Elsevier Science S.A.

Minami, "Transparent Conducting Oxide Semiconductors for Transparent Electrodes", Semiconductor Science and Technology, (2005), pp. S35-S44, vol. 20, Institute of Physics Publishing.

Grazulevicius et al., "Charge-Transporting Polymers and Molecular Glasses", Handbook of Advanced Electronic and Photonic Materials and Devices, edited by H.S. Nalwa, (2001), pp. 233-274, vol. 10, Academic Press.

Chen et al., "Recent Developments in Molecular Organic Electroluminescent Materials", Macromol. Symp., (1997), pp. 1-48, vol. 125, Hüthig & Wepf Verlag, Zug.

ASTM D 1003-07, Standard Test Method for "Haze and Luminous Transmittance of Transparent Plastics", pp. 1-7, ASTM International.

E. M. Corcoran, "Determining Stresses in Organic Coatings Using Plate Beam Deflection," Journal of Paint Technology, vol. 41, No. 538, pp. 635-640, Nov. 1969.

L. F. Francis, A. V. McCormick, and D. M. Vaessen, "Development and Measurement of Stress in Polymer Coatings," Journal of Materials Science, 37: 4717-4731, 2002.

R. P. Swanson, "Measurement of Web Curl," Proceedings of the Applied Webhandling Conference, AIMCAL, May 7-10, 2006, 9 pages.

S.G. Croll, "Internal Stress in a Solvent-Cast Thermoplastic Coating," Journal of Coatings Technology, vol. 50, No. 638, pp. 33-38, Mar. 1978.

* cited by examiner

METHOD FOR MANUFACTURING ON A FILM SUBSTRATE AT A TEMPERATURE ABOVE ITS GLASS TRANSITION

TECHNICAL FIELD

The present invention is related to manufacturing of, e.g. organic light-emitting diodes using a film substrate as a base. More particularly the accomplishment of a manufacturing step carrying the film substrate above its glass transition temperature without causing dimensional instability in the final product is disclosed.

BACKGROUND

Recently there has been considerable commercial success in the area of electronic devices having visual displays. Small hand held devices such as cell phones, PDA's, and mp3 players, and larger displays for television, signage and computers, depend to some extent on the appeal of their visual displays. Considerable work has been done trying to optimize such properties as brightness, color intensity, and power consumption in these displays. One active area of research is in effectively using organic light emitting diodes (OLEDs) and polymer light emitting diodes (PLEDs). Displays based on OLEDs and PLEDs offer substantial rewards in terms of being self-emitting (no need for back lighting), thinner, and lighter than more traditional illumination sources. However, because of the oxygen and moisture sensitivity of these classes of diode materials, the only currently generally suitable substrate material for OLED/PLED displays is glass.

Glass is used because of its superb water and oxygen barrier properties, and also because of its optical and mechanical stability. However, the art laments its lack of flexibility and the large minimum thickness in which glass can be provided. To replace glass, a plastic substrate would have to not only be flexible, but able to offer the properties of glass i.e. clarity, dimensional stability, thermal stability, barrier, solvent resistance, low coefficient of thermal expansion (CTE) coupled with a smooth surface. Currently no plastic films offer all these properties. Some plastic films come close to these required properties, e.g. polyester terephthalate (PET) and polyester naphalate (PEN), but they fall down with respect to thermal stability. Some of the processes involved in laying down organic light emitting and current conducting layers on the substrate are above the glass transition temperature of these polymers. Traditional manufacturing techniques would leave a polymeric substrate mechanically distorted by heat.

SUMMARY

The present invention provides a novel method in which a flexible film substrate with a low glass transition temperature can be used in the production of an article that retains dimensions and improves the surface smoothness after high temperature processing. The invention, for example, would enable low temperature films, defined as plastic films with a glass transition temperature less than 200° C. of which PET, PEN, and their copolymers would be common examples, to be dimensionally stable and ultra flat (roughness<5 nanometers) at conditions commonly used in electronic processing which can typically exceed 200° C. More specifically, the methods enable the use of e.g. barrier films based on PET, PEN, or their copolymers in OLED/PLED manufacturing. Other applications exist in e.g. solar cells, electro-chromic displays, liquid crystal displays, and other electronic apparatus where the requirement for barrier properties is high.

In one aspect, the present invention may be thought of as a method of preparing a film for elevated temperature processing. In the method, a film is provided having a polymeric substrate having a glass transition temperature under 200° C. The film also has at least one layer of metal oxide and at least one layer of coated polymer. This film is clamped so as to place the film under tension in at least one direction, preferably two orthogonal directions. The clamped film is above its glass transition temperature. In preferred embodiments, the tension in the at least two orthogonal directions is sufficient to prevent sagging of the film during the heating.

The clamping may be performed in a number of ways, one of which is the use of a clamping fixture. Such a device can be made of various materials, but it is preferred that the clamping frame be made from a material having a low thermal expansion. For example, aluminum has thermal expansion of $23 \times 10^{-6}$/° C.; copper has thermal expansion of $17 \times 10^{-6}$/° C.; iron or steel has thermal expansion of $12 \times 10^{-6}$/° C.; glass has thermal expansion of $3\text{-}8 \times 10^{-6}$/° C. quartz has thermal expansion of $0.59 \times 10^{-6}$/° C. However, the invention also contemplates that the method could also be carried out without a discrete fixture, using tentering techniques to hold the substrate in the requisite manner during a roll-to-roll process. More particularly) a roll of indefinite length substrate could pass a film preparation station in a step-and-repeat operation, conveniently such that the tentering grips apply the same tension in the cross-web direction that the web advancing apparatus is applying in the machine direction.

Further, the surface of suitable substrate films for PLED or OLED preferably has an average roughness of less than about 10 nm, more preferably less than 5 nm. The surface finish of a proposed substrate can be evaluated by forming a test cut in a substrate film and evaluating the test cut with a microinterferometer, such as can be purchased from WYKO (Tucson, Ariz.), a division of Veeco.

The method has particular advantages when applied to substrates where the glass transition temperature is under about 120° C., because of the otherwise excellent properties of some of the polymers in that range. (Note: as used herein, a Tg of about 120° C. ranges from about 115° C. to 130° C., depending on the measurement technique used). In particular, PEN, PET and their copolymers fall into this category and are considered particularly suitable for use in connection with the present invention. Polypropylene, among other polymers, is also considered suitable, and has the advantage of low cost. It is often the case that commercial suppliers of these films provide them with a built-in biaxial orientation. When this is the case, it is believed advantageous to perform the clamping such that at least one direction, preferably two orthogonal directions are aligned with the biaxial orientation of the film.

In circumstances when the method is being employed to manufacture OLED or PLED devices, the method can further include depositing a layer of a transparent conductive material onto the film, and sequentially an organic hole-transport layer onto the film while still clamped. Numerous materials are considered suitable to serve as the transparent conductive material, including $SnO_2$, $In_2O_3$, $ZnO$, $CdO$, $ZnO\text{—}SnO_2$, $ZnO\text{—}In_2O_3$, $In_2O_3\text{—}SnO_2$, $CdO\text{—}SnO_2$, $CdO\text{—}In_2O_3$, $MgIn_2O_4$, $GaInO_3$, $(Ga,In)_2O_3$, $CdSb_2O_6$, $ZnO\text{—}In_2O_3\text{—}SnO_2$, $CdO\text{—}In_2O_3\text{—}SnO_2$, and $ZnO\text{—}CdO\text{—}In_2O_3\text{—}SnO_2$. Indium-tin oxide is considered particularly suitable to serve as the transparent conductive material. Additional information on the use of transparent conductive materials can be found in Minami, T., "Transparent Conducting Oxide Semiconductors for Transparent Electrodes," *Semicond. Sci. Tech.* 20 (2005) S35-S44, which is hereby incorporated by reference as if rewritten. Best results are obtained when after such deposition the substrate and the deposited layers remain clamped until after the structure is cooled below the glass transition temperature of the substrate. A description of how these additional layers may be applied may be found in U.S. Patent Publication 2006/0024895 A1 (assigned to Samsung), which is hereby incorporated by reference as if rewritten.

DETAILED DESCRIPTION

Figure 1:
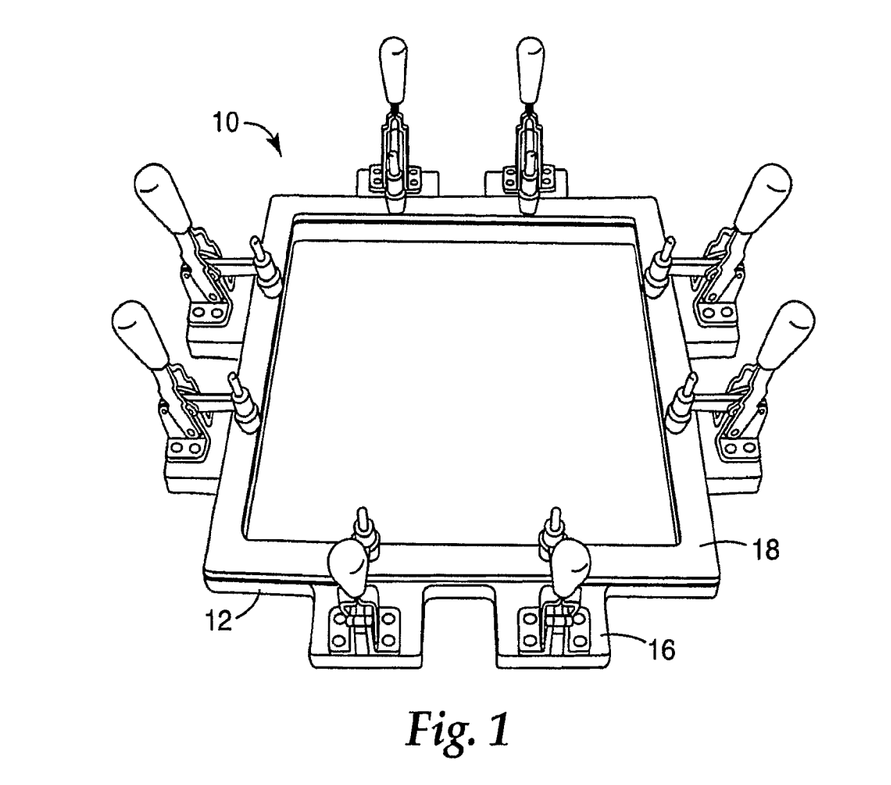
FIG. 1 shows a perspective view of a clamping fixture suitable for carrying out one embodiment of the method according to the present invention.

Referring now to FIG. 1, a perspective view of a clamping fixture 10 suitable for carrying out one embodiment of the method according to the present invention is illustrated. The clamping fixture 10 includes two major parts, the lower part 12 that features eight clamps 14 mounted on projecting flanges 16, and an upper part 18 that can be releasably fixed against the lower part 12 when the clamps 14 are engaged as illustrated. When the clamping fixture is used in furtherance of the method, the film is bound between the upper part 18 and the lower part 12. Although a square clamping fixture is depicted in the illustrative drawing, the ordinary artisan will appreciate that clamping fixtures in many different shapes, including circular ones, can place the film under tension in at least two orthogonal directions.

Figure 2:
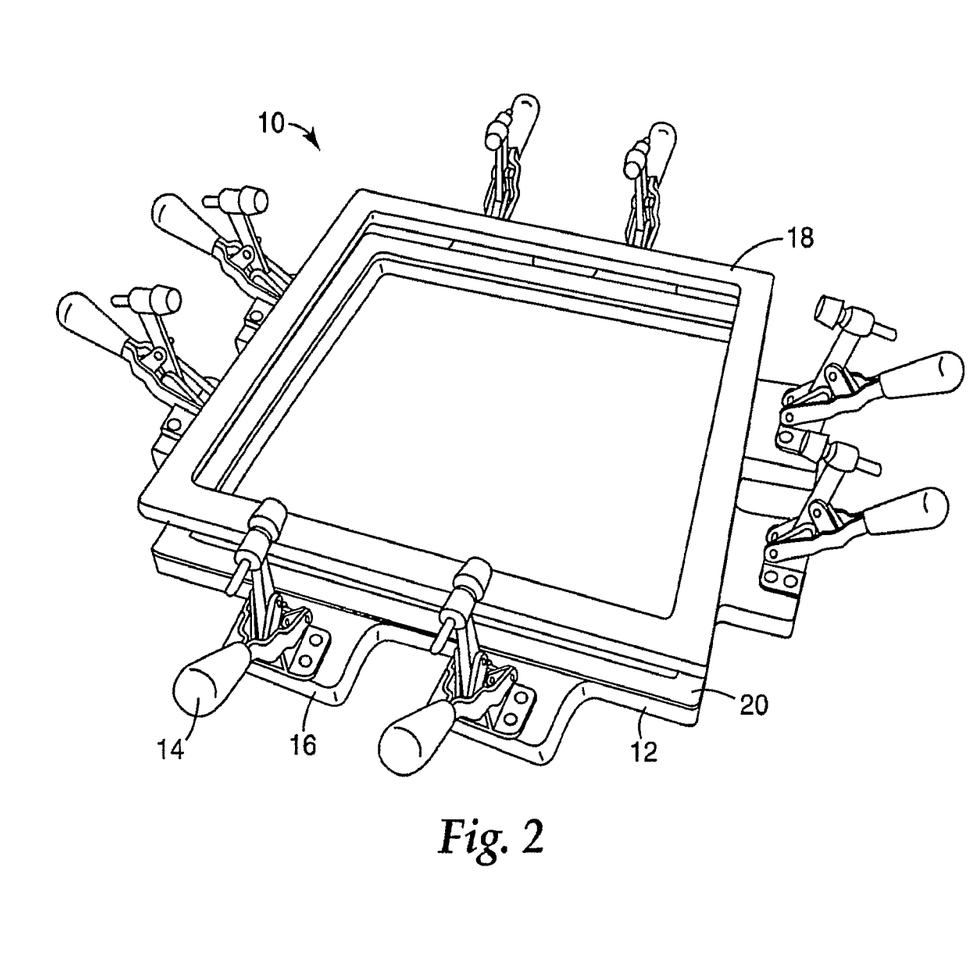
FIG. 2 shows the clamping fixture of FIG. 1 in an exploded view.

Referring now to FIG. 2, the clamping fixture 10 of FIG. 1 is illustrated in exploded view. Compared to FIG. 1, the clamps 14 have all released, and the upper part 18 is shown lifted above and away from its previous position engaging the lower part 12. In this view, it can be appreciated that the lower part 12 includes a trough 20.

Figure 3:
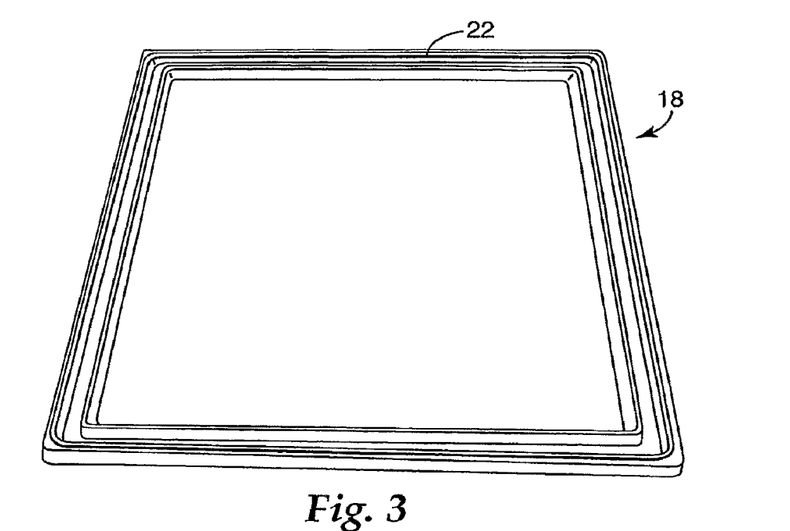
FIG. 3 shows a perspective view of the underside of the upper part of the clamping fixture of FIG. 1.

Referring now FIG. 3, a perspective view of the underside of the upper part 18 of the clamping fixture of FIG. 1 is shown. In this view it can be appreciated that the upper part 18 has a raised ridge 22 adapted to interact with the trough 20 on lower part 12. Acting together, the raised ridge 22 and the trough 20 increase the gripping power of the clamping frame 10 on a piece of film bound between the upper part 18 and the lower part 12. While a means to increase the gripping force is considered preferred, it is not a required part of the method. And when such a means is present, the ridge-and-trough in the illustrative figures is only one of many expedients that will suggest themselves to the ordinary artisan.

As alluded to above, many clamping mechanisms may be employed so long as they can bind the film in a zero strain condition while the film is taken through particular temperature ranges and thereby the film's internal stresses are manipulated advantageously. While not wishing to be bound by theory, it is believed that below a temperature of approximately 92° C. the thermal expansion of biaxially oriented PEN is at its greatest. Around 160° C. it begins to undergo contraction, until it has shrunk below its original size. If the film is clamped, the film is conditioned by a thermal treatment at high temperature for a short amount time. Internal stress builds up and the film becomes taut. It is believed that this conditioning is important in two ways. First, it utilizes the shrinking nature of the biaxially oriented film to achieve a very flat surface. This is advantageous when, e.g. depositing OLED/PLED components onto the film is a second operation. Second, after such deposition, which might hold the film at a high temperature for up to an hour, the film with its additional layers remains flat and distortion free when released from the clamp.

The conditioning step can be as short as a few seconds and as long as a few minutes. The conditioning temperature can be somewhere between the Tg and Tm (melting point) of the polymer. For PET and PEN, a conditioning temperature between about 120° C. to 260° C. is considered preferred.

Figure 4:
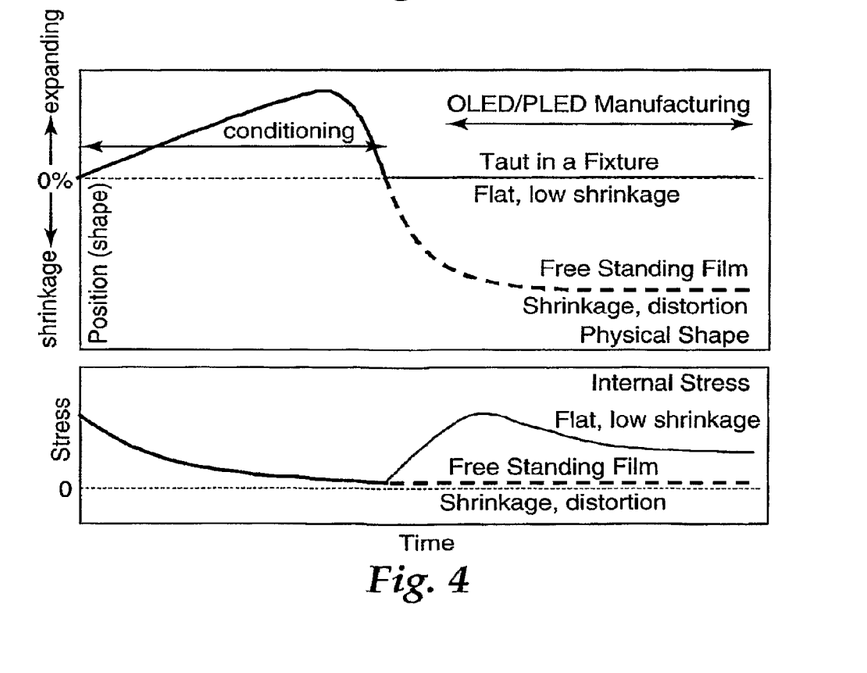
FIG. 4 shows two graphs which illustrate exemplary stress and strain performance of a suitable polymer, in both clamped and unclamped situations.

The foregoing discussion can be more readily appreciated in connection with FIG. 4, which shows two graphs which illustrate exemplary stress and strain performance of a suitable polymer, in both clamped and unclamped situations. As the film is heated up, it expands (red solid line). But a biaxially stretched film of, e.g. PET or PEN would shrink above 160-180° C. In the case of a free standing film, the physical shape and the internal stresses would follow the red dotted lines. But in the case of a clamped film, the same film is taut in place with zero strain and built up internal stress (green solid lines). The freestanding film would release its internal stress to nearly zero upon heating up thus causing dimensional instability.

In a clamped film that has undergone a heating to condition it, the internal stress holds the film flat, while e.g. OLED/PLED processing can be carried out at high temperatures (i.e. 180° C.) with multiple steps without deformation of the taut film over extended periods of time. After the OLED/PLED processing is finished, the whole device is cooled down to ambient condition with the substrate film taut in the fixture.

Some of the operations that could be part of OLED/PLED processing will now be discussed in greater detail. Such devices, generically organic electroluminescent devices (OELs), include layers of organic materials, at least one of which can conduct a charge. Specific OEL devices, sometimes referred to as lamps, are desirable for use in electronic media because of their thin profile, low weight, and low driving voltage. OEL devices have potential use in applications such as, for example, lighting applications, backlighting of graphics, pixelated displays, and large emissive graphics.

OEL devices typically include an organic light emitter layer and optionally one or more charge transport layers, all of which are sandwiched between two electrodes: a cathode and an anode. Charge carriers, electrons and holes, are injected from the cathode and anode, respectively Electrons are negatively charged atomic particles and holes are vacant electron energy states that behave as though they are positively charged particles. The charge carriers migrate to the emitter layer, where they combine to emit light.

The emitter layer includes one or more light emitting materials, such as a small molecule (SM) emitter, a SM doped polymer, a light emitting polymer (LEP), a doped LEP, a blended LEP, another organic emissive material, or any combination of these materials. Examples of classes of suitable LEP materials include poly(phenylenevinylene)s (PPVs), poly-para-phenylenes (PPPs), polyfluorenes (PFs), other LEP materials now known or later developed, and co-polymers or blends thereof. Suitable LEPs can also be molecularly doped, dispersed with luminescent dyes or other photoluminescent (PL) materials, blended with active or non-active materials, dispersed with active or non-active materials, and the like. Examples of suitable LEP materials are described in, for example, Kraft, et al., *Angew. Chem. Int. Ed.,* 37, 402-428 (1998); U.S. Pat. Nos. 5,621,131; 5,708,130; 5,728,801; 5,840,217; 5,869,350; 5,900,327; 5,929,194; 6,132,641; and 6,169,163; and PCT Patent Application Publication No. 99/40655, all of which are incorporated herein by reference.

SM materials are generally non-polymer organic or organometallic molecular materials that can be used in organic electroluminescent displays and devices as emitter materials, charge transport materials, as dopants in emitter layers (e.g., to control the emitted color) or charge transport layers, and the like. Commonly used SM materials include metal chelate compounds, for example, tris(8-hydroxyquinoline) aluminum (AlQ) and derivatives thereof, and organic compounds, for example, N,N'-bis(3-methylphenyl)-N,N'-bis(phenyl) benzidine (TPD). Other SM materials are disclosed in, for example, C. H. Chen, et al., *Macromol. Symp.* 125, 1 (1997), Japanese Laid Open Patent Application 2000-195673, U.S. Pat. Nos. 6,030,715, 6,150,043, and 6,242,115 and, PCT Patent Applications Publication Nos. WO 00/18851 (divalent lanthanide metal complexes), WO 00/70655 (cyclometallated iridium compounds and others), and WO 98/55561, all of which are incorporated herein by reference.

A hole transport layer may optionally be present in OEL devices to facilitate the injection of holes from the anode into the device and their migration towards the recombination zone. Such a hole transport layer can further act as a barrier for the passage of electrons to the anode. The hole transport layer can include, for example, a diamine derivative, such as N,N'-bis(3-methylphenyl)-N,N'-bis(phenyl)benzidine (also known as TPD) or N,N'-bis(3-naphthalen-2-yl)-N,N'-bis(phenyl)benzidine (NPD), or a triarylamine derivative, such as, 4,4',4"-Tris(N,N-diphenylamino)triphenylamine (TDATA), 4,4',4"-tris(N-3-methylphenyl-N-phenylamino) triphenylamine (MTDATA), 4,4',4"-tri(N-phenothiazinyl) triphenylamine (TPTTA), 4,4',4"-tri(N-phenoxazinyl) triphenylamine (TPOTA). Other examples include copper phthalocyanine (CuPC); 1,3,5-Tris(4-diphenylaminophenyl)benzenes (TDAPBs); poly(vinyl carbazole); and other compounds such as those described in Shirota, *J. Mater. Chem.*, 10, 1 (2000), H. Fujikawa, et al., *Synthetic Metals*, 91, 161 (1997), and J. V. Grazulevicius, P. Strohriegl, "Charge-Transporting Polymers and Molecular Glasses", *Handbook of Advanced Electronic and Photonic Materials and Devices*, H. S. Nalwa (ed.), 10, 233-274 (2001), all of which are incorporated herein by reference.

An electron transport layer may optionally be present in OEL devices to facilitate the injection of electrons and their migration towards the recombination zone. Such an electron transport layer can further act as a barrier for the passage of holes to the cathode 258, if desired. As an example, the electron transport layer 262 can be formed using the organometallic compound tris(8-hydroxyquinolato) aluminum (AlQ). Other examples of electron transport materials include 3-(4-biphenylyl)-4-phenyl-5-(4-tert-butylphenyl)-1,2,4-triazole (TAZ), 1,3-bis[5-(4-(1,1-dimethylethyl)phenyl)-1,3,4-oxadiazol-2-yl]benzene, 2-(biphenyl-4-yl)-5-(4-(1,1-dimethylethyl)phenyl)-1,3,4-oxadiazole (tBuPBD) and other compounds described in Shirota, *J. Mater. Chem.*, 10, 1 (2000), C. H. Chen, et al., *Macromol. Symp.* 125, 1 (1997), and J. V. Grazulevicius, P. Strohriegl, "Charge-Transporting Polymers and Molecular Glasses", *Handbook of Advanced Electronic and Photonic Materials and Devices*, H. S. Nalwa (ed.), 10, 233 (2001), all of which are incorporated herein by reference.

The method described herein of the present invention can also be used to manufacture liquid crystal and electrochromic displays where high temperatures are utilized, and also in making thin film transistors on the film. (See e.g. US2006/0024895 A1). Additionally, the method can be used to manufacture flexible solar cells where high temperature processing steps are encountered. Applications in the manufacture of illumination devices and of static or active signage are also foreseen.

EXAMPLE 1

A sample of biaxially oriented PEN film 0.123 mm thick, commercially available as Q65FA from DuPont Teijin Films of Hopewell, Va. was assessed for several properties of interest in the manufacture of optical films. Specifically, its transmittance (T, %) was tested to be 89.5. Its haze (H, %) was tested to be 0.99. Its clarity (C, %) was tested to be 100. The transmittance and haze are measured according to ASTM D-1003. Clarity is measured according to the test methods described in the manual for the Hazeguard® Plus (available from BYK-Gamer USA, Silver Spring, Md.).

As a control experiment, a square portion of this material, sized 30 cm by 30 cm, was cut from the material with the biaxial orientation of the film aligned with the cutting axes. This portion was subjected to a heat treatment of 5 minutes (mimicking a high temperature OLED/PLED processing step) at a temperature of 240° C. This was performed in an oven with temperature set at 240° C. and the film was suspended in an oven without restraint or tension.

Upon the conclusion of this heat treatment, it was noted that the film had physically shrunk, differently in the two axes. Specifically, it had shrinkage of 4.59% in the cross-web direction and 4.07% in the machine direction, measured by reference marks 20 cm apart. Further, the optical properties had changed as well, such that the transmittance was 89.9, the haze was 2.32, and the clarity was 99.7. The resulting film is highly curled.

EXAMPLE 2

A different portion of the film used in Example 1 was fixed in a square aluminum frame as illustrated in FIG. 1. The clamps imparted a normal pressure of 3-6 MPa each, which because of the geometry of the film-gripping surfaces imparted a nearly-zero tension in the film along the axes defined by the biaxial orientation. The clamped film was subjected to a conditioning cycle at 240° C. for 15 seconds in the same oven of Example 1. During this conditioning, the film underwent thermal expansion and then shrinkage to form a flat film that tightly fit the frame geometry. This conditioning cycle was chosen such that the temperature was high enough to initiate some shrinkage of the film whereas the time is short enough such that the film internal stress is not totally relaxed out. The conditioned film, still in its frame, was then subjected to a heat treatment at 240° C. for 5 minutes under conditions otherwise similar to Example 1. The thermal shrinkage and optical properties are then measured according to the methods of Example 1, but these tests were conducted while the film was still taut in the fixture. Specifically, after the thermal treatment, the film showed shrinkage of 0.00% in cross-web direction and −0.09% in the machine direction. The optical properties remained were unchanged from those possessed before the conditioning and the heat treatment. Within the clamp, the heat treated did not show any visible curl or distortion.

EXAMPLE 3

An experiment was performed substantially according to Example 2, except that the film was taken out of the clamp before the thermal shrinkage and optical properties were measured. Specifically, after the thermal treatment and release from the clamp, the film showed shrinkage of 0.56% in TD direction and 0.01% in MD direction, which is significantly lower than the free standing film as shown in example 1. The optical properties were also assessed as described in Example 1, both before and after the heat treatment, with the result that these properties were unchanged by the processing. The resulting film was free of visible curl or distortion. Examples 1-3 imply that at least the bare substrate can be shielded from curl and distortion during a processing above its glass transition temperature by the use of clamping according to the present invention. Examples 4-6 describe the extension of this discovery to a more advance case wherein the substrate has barrier layers pre-applied upon one surface.

EXAMPLE 4

A PEN film like that of Example 1 was transformed into a moisture/oxygen barrier film by vapor depositing on the PEN film alternating layers of SiAlOx and acrylate polymer, seven deposited layers total starting with the metal oxide. This was accomplished according to the method of Example 1 of copending and coassigned US patent application 2004/195967 to Padiyath and Roehrig, which is hereby incorporated by reference as if rewritten. Its optical properties were determined according to the methods of Example 1, and its transmittance was 92.0, its haze was 0.91, and its clarity was 100.

This film was subjected to a heat treatment at 240° C. for 5 minutes (mimicking high temperature OLED/PLED processing step). This was performed in an oven generally as described in Example 1. Upon the conclusion of this heat treatment, it was noted that the film had physically shrunk, differently in the two axes. Specifically, it had shrinkage of 3.50% in the cross-web direction and 2.75% in the machine direction, measured by reference marks 20 cm apart. The treated film was highly curled and distorted due to the imbalanced thermal expansion/shrinkage on each side of the film, leading to the breakage of the deposited barrier layers.

EXAMPLE 5

Another piece of moisture/oxygen barrier film was prepared according to the method of Example 4. Its optical properties were determined according to the methods of Example 1, and its transmittance was 91.1, its haze was 1.06, and its clarity was 100. In a manner similar to that described in Example 2, this film was fixed in a square aluminum frame as illustrated in FIG. 1. The clamps imparted a normal pressure of 3-6 MPa each, which because of the geometry of the film-gripping surfaces imparted a nearly-zero tension in the film along the axes defined by the biaxial orientation. The normal pressure is high enough to prevent the slippage of the film during the film shrinking upon heating.

The clamped film was subjected to a conditioning cycle at 240° C. for 15 seconds while the film was taut in a fixture. This caused the film to go through an expansion and contraction to tightly fit to the frame geometry, for the reasons discussed in Example 2. Also as in Example 2, the clamped film was subjected to a heat treatment at 240° C. for 5 minutes.

After the clamped film had cooled to room temperature, the film was taken out of the fixture and the thermal shrinkage and optical properties were measured. Specifically, after the thermal treatment, the film showed shrinkage of 0.07% in the cross-web direction and 0.00% in the machine direction, which is significantly lower than the free standing film as shown in Example 4. The optical properties remained essentially unchanged.

EXAMPLE 6

Another piece of moisture/oxygen barrier film used in Example 5 was treated as described in that Example, except that the heat treatment after the conditioning was performed for 10 minutes, rather than 5. After the clamped film had cooled to room temperature, the film was taken out of the fixture and the thermal shrinkage and optical properties were measured. Specifically, after the thermal treatment, the film showed shrinkage of −0.33% in the cross-web direction and 0.27% in the machine direction, which is still significantly lower than the free standing film as shown in Example 4. The optical properties remained essentially unchanged by the conditioning and the heat treatment. Examples 4-6 imply that at not only the bare substrate, but also barrier layers vapor deposited on the substrate can be shielded from curl and distortion during a processing above the glass transition temperature of the substrate by the use of clamping according to the present invention.

EXAMPLE 7

A control barrier film sample according to Example 4, except that no heat treatment was performed on it, was assessed to determine its water vapor transmission rate (WVTR). WVTR measurements were made using a Permatran 700 series instrument commercially available from Mocon Instruments of Minneapolis Minn. Following the testing protocols for that instrument, WVTR was measured under testing conditions of 50° C., 100% RH, and 0% $O_2$. The WVTR under these conditions was <0.005 g/m$^2$/day. The heat treated samples of Examples 5 and 6 were also tested with this instrument, and were also found to have a WVTR of <0.005 g/m$^2$/day. This example demonstrates that the process disclosed by this invention can be used with multi-layer barriers films without degrading the barrier performance.

EXAMPLE 8

A biaxially oriented PEN film was prepared by taking PEN in the form of pellets made by 3M of St. Paul, Minn. and melting them and extruding them in a twin screw extruder to form a cast web. This cast web was then subsequently stretched using a biaxial stretcher, commercially available as KARO IV from Bruckner German Technology, Germany. The final draw ratio was about 3.5 by 3.5, and resulted in a film having a thickness of 120 micrometers.

A sample of this biaxially oriented PEN film was assessed for surface roughness using a micro-interferometer, commercially available from WYKO of Tucson, Ariz. This method reports three aspects of surface roughness: the roughness average, $R_a$ (a measure of the arithmetic average deviation of the centerline); the roughness skew, $R_{sk}$ (a measure of how much area is above or below the mean height); and the roughness kurtosis, $R_{ku}$ (a measure of the concavity of the surface features).

Five portions of the biaxially oriented PEN film were then placed in the clamping fixture according to Example 2 and then conditioned at 240° C. for 15 seconds. After the film has gone through the expansion and shrinking to tightly fit to the frame geometry, the film is followed by a heat treatment at different processing conditions as listed in the following table. As shown below, the processing temperature is as high as 240° C. (30-60 seconds) and the processing time is as long as 1 hour (at 180° C.). These samples were also assessed for surface roughness, with the results tabulated below:

| WYKO Surface Roughness Results | | | |
|---|---|---|---|
| Sample ID | Ra, nm | Rsk | Rku |
| Control Film | 11.41 | 23.99 | 837.22 |
| 240 C. 30 seconds Film Sample #1 | 8.37 | 16:34 | 536.89 |
| 240 C. 30 seconds Film Sample #2 | 7.40 | 5.29 | 207.62 |
| 240 C. 60 seconds Film Sample #1 | 5.33 | 0.04 | 3.25 |
| 240 C. 60 seconds Film Sample #2 | 5.32 | 0.01 | 3.42 |
| 180 C. 1 hour Film Sample #1 | 4.91 | 0.26 | 8.03 |

As compared to the control film that does not experience additional heat treatment, the high temperature processing in a fixture as described by the present invention has the advantage of obtaining a film article that has two surfaces with superb flatness ($R_a$<5 nm), nearly zero height ($R_{sk}$≈0) and nearly random characteristics ($R_{ku}$≈3), all of which are useful in OLED/PLED and other electronics processing applications.

While the invention has been particularly shown and described with reference to various embodiments thereof, it will be understood by those skilled in the art that various other changes in the form and details may be made therein without departing from the spirit and scope of the invention.

What is claimed is:

1. A method for elevated temperature processing of a film, comprising:
    providing a film comprising a polymeric substrate having a glass transition temperature under about 200° C., and further comprising at least one layer of metal oxide and at least one layer of coated polymer;
    clamping the film so as to place the clamped film under tension in at least two orthogonal directions; and
    holding the clamped film flat in a zero strain condition while subjecting the clamped film to elevated temperature processing comprising heating the clamped film in the zero strain condition above the glass transition temperature of the polymeric substrate, wherein the clamped film does not show any visible curl or distortion when unclamped after said elevated temperature processing.

2. The method according to claim 1 further comprising depositing an organic hole-transport layer onto the clamped film.

3. The method according to claim 1 further comprising depositing a layer of a transparent conductive material onto the clamped film.

4. The method according to claim 3 wherein the transparent conductive material is indium-tin oxide.

5. The method according to claim 1 further comprising cooling the clamped film below the glass transition temperature of the polymeric substrate.

6. The method according to claim 1 wherein the glass transition temperature is under about 120° C.

7. The method according to claim 6 wherein the polymeric substrate is selected from the group consisting of PET, PEN, and copolymers thereof.

8. The method according to claim 1 wherein the tension in the at least two orthogonal directions is sufficient to prevent sagging of the clamped film during the heating.

9. The method according to claim 1 wherein the provided film has a biaxial orientation, and wherein the at least two orthogonal directions are aligned with the biaxial orientation.

10. The method according to claim 1 wherein after the heating the substrate has an average surface roughness less than 10 nm.

11. The method according to claim 1 wherein after the heating the substrate has a water vapor transport rate (WVTR) of less than 0.005 g/m$^2$/day.

12. The method according to claim 1 wherein after the heating the substrate displays a shrinkage of less than 0.01% in at least two orthogonal directions.

13. The method according to claim 1 further comprising unclamping the clamped film to provide an unclamped film and depositing a layer of a transparent conductive material onto the unclamped film.

14. The method according to claim 1 further comprising unclamping the clamped film to provide an unclamped film and depositing a layer of an organic hole-transport layer onto the unclamped film.

15. The method of claim 1, wherein heating the clamped film above the glass transition temperature of the polymeric substrate is carried out above about 180° C.

16. The method of claim 1, wherein the method is used to make a device taken from the group consisting of: an OLED display, liquid crystal display, electrochromic display, thin film transistor device, flexible solar cell, photovoltaics, illumination devices and signage.

* * * * *

UNITED STATES PATENT AND TRADEMARK OFFICE
CERTIFICATE OF CORRECTION

PATENT NO. : 8,871,298 B2  Page 1 of 1
APPLICATION NO. : 12/278431
DATED : October 28, 2014
INVENTOR(S) : Mark Roehrig It is certified that error appears in the above-identified patent and that said Letters Patent is hereby corrected as shown below:

In the Specification

Column 2
Line 24, delete "particularly)" and insert -- particularly, --, therefor.

Column 5
Line 17-18, delete "(cyclometallated" and insert -- (cyclometalated --, therefor.

Column 5
Line 49, delete "hydroxyquinolato)" and insert -- hydroxyquinolinato) --, therefor.

Column 6
Line 16 (Approx.), delete "BYK-Gamer" and insert -- BYK-Garner --, therefor.

Signed and Sealed this
Ninth Day of June, 2015

Michelle K. Lee
*Director of the United States Patent and Trademark Office*